US006723490B2

(12) United States Patent
Patel et al.

(10) Patent No.: US 6,723,490 B2
(45) Date of Patent: Apr. 20, 2004

(54) MINIMIZATION OF ABLATION IN THERMALLY IMAGEABLE ELEMENTS

(75) Inventors: Jayanti Patel, Woodcliff Lake, NJ (US); Paul West, Fort Collins, CO (US); Kevin Ray, Fort Collins, CO (US); Kevin Williams, Rochester, NY (US)

(73) Assignee: Kodak Polychrome Graphics LLC, Norwalk, CT (US)

(*) Notice: Subject to any disclaimer, the term of this patent is extended or adjusted under 35 U.S.C. 154(b) by 89 days.

(21) Appl. No.: 09/999,587

(22) Filed: Nov. 15, 2001

(65) Prior Publication Data

US 2003/0108817 A1 Jun. 12, 2003

(51) Int. Cl.$^7$ .................................................. G03F 7/11

(52) U.S. Cl. ................................ 430/271.1; 430/273.1; 430/275.1; 430/278.1; 430/281.1; 430/286.1; 430/287.1; 430/288.1; 430/302; 430/306; 430/348; 430/434; 430/494; 430/944; 430/945; 101/453; 101/463.1; 101/465

(58) Field of Search .......................... 430/270.1, 271.1, 430/273.1, 275.1, 278.1, 281.1, 285.1, 286.1, 287.1, 288.1, 302, 306, 348, 401, 434, 494, 944, 945, 964; 101/453, 463.1, 465

(56) References Cited

U.S. PATENT DOCUMENTS 6,159,657 A * 12/2000 Fleming et al. .......... 430/270.1
6,294,311 B1 9/2001 Shimazu et al. ......... 430/271.1
2003/0104307 A1 * 6/2003 Shimazu et al. ............ 430/166

FOREIGN PATENT DOCUMENTS

| | | |
|---|---|---|
| EP | 0 864 420 A1 | 9/1998 |
| EP | 0 908 305 A1 | 4/1999 |
| EP | 0 908 307 A2 | 4/1999 |
| EP | 0 908 779 A1 | 4/1999 |
| EP | 0 908 784 A1 | 4/1999 |
| EP | 0 909 657 A2 | 4/1999 |
| EP | 0 922 570 A2 | 6/1999 |
| EP | 0 940 266 A1 | 9/1999 |
| EP | 0 950 518 A1 | 10/1999 |
| EP | 0 960 728 A1 | 12/1999 |
| EP | 1 023 994 A1 | 8/2000 |
| EP | 1 052 113 A1 | 11/2000 |
| JP | 2000355178 | 12/2000 |

* cited by examiner

*Primary Examiner*—Mark F. Huff
*Assistant Examiner*—Barbara Gilliam
(74) *Attorney, Agent, or Firm*—RatnerPrestia

(57) ABSTRACT

Positive-working thermally imageable elements, useful as printing plate precursors and having reduced ablation when thermally imaged, and methods for their preparation are disclosed. In one aspect, the elements contain a hydrophilic substrate, an underlayer, a barrier layer, and a top layer. The underlayer comprises a photothermal conversion material.

31 Claims, No Drawings

MINIMIZATION OF ABLATION IN THERMALLY IMAGEABLE ELEMENTS

FIELD OF THE INVENTION

This invention relates to lithographic printing. More particularly, this invention relates to multi-layer thermally imageable elements, useful as lithographic printing plate precursors, that can be thermally imaged and processed with aqueous alkaline developers.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise an imageable layer applied over the hydrophilic surface of a substrate. The imageable layer includes one or more radiation-sensitive components, which may be dispersed in a suitable binder. Alternatively, the radiation-sensitive component can also be the binder.

Thermally imageable elements useful as lithographic printing plate precursors, which obviate the need for exposure through a mask, are becoming increasingly important in the printing industry. After imagewise thermal exposure, the rate of removal of the exposed regions by a developer in positive-working elements is greater than the rate of removal of the unexposed regions so that the exposed regions are removed by the developer to form an image. Such systems are disclosed in, for example, Parsons, WO 97/39894 and U.S. Pat. No. 6,280,899; Nagasaka, EP 0 823 327; Miyake, EP 0 909 627; West, WO 98/42507; and Nguyen, WO 99/1145.

One difficulty with the use of lithographic printing plates is ablation of the imageable layer during imaging. The material ablated from these plates during imaging collect on the lenses, optics and focusing devices of the imaging device, known as a platesetter. After a period of reasonable use, the platesetter can have a thin film of ablated material covering the main focusing lens. Imaging errors then occur. Consequently, the platesetter must be cleaned frequently to prevent these errors.

Platesetters using plates designed to ablate on exposure have powerful "vacuum cleaners" and filtration systems. Users do not prefer these machines because of their cost, noise, and size. As the sensitivity of the thermally imageable elements increases, the potential for ablation increases.

Thus, a need exists for imageable elements that have reduced ablation to reduce the cleaning of platesetters and to reduce their cost, noise, and size.

SUMMARY OF THE INVENTION

The invention is a positive-working thermally imageable element, useful as a printing plate precursor, having reduced ablation when thermally imaged. The element comprises:

(a) a hydrophilic substrate;

(b) an underlayer, (c) a barrier layer; and, (d) a top layer;

in which:

the top layer comprises a first polymeric material;

the underlayer comprises a second polymeric material;

the barrier comprises a third polymeric material;

the top layer is ink receptive and insoluble in an alkaline developer;

the top layer, the barrier layer, and the underlayer are each removable by the alkaline developer following thermal exposure of the element;

the underlayer comprises a photothermal conversion material; and the barrier layer and the top layer are substantially free of photothermal conversion material.

DETAILED DESCRIPTION OF THE INVENTION

Unless the context indicates otherwise, in the specification and claims, the terms "first polymeric material," "second polymeric material," "third polymeric material," "photothermal conversion material," "dissolution inhibitor," "infrared absorber," and similar terms also refer to mixtures of such materials.

This invention is a thermally imageable element. The element comprises a hydrophilic substrate, an underlayer, a barrier layer, and a top layer. The underlayer comprises a photothermal conversion material.

Hydrophilic Substrate

The hydrophilic substrate, i.e., the substrate that comprises at least one hydrophilic surface, comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

The surface of the aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 $\mu$m.

Typically, the substrate comprises an interayer between the aluminum support and the imageable layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

Underlayer

The underlayer is between the hydrophilic surface of the hydrophilic substrate and the absorber layer. After imaging, it is removed in the imaged regions along with the absorber layer and the top layer by the developer to expose the underlying hydrophilic surface of the substrate. It is preferably soluble in the developer to prevent sludging of the developer.

The underlayer comprises a second polymeric material. The second polymeric material preferably is soluble in an aqueous alkaline developer. In addition, when the second polymeric material and third polymeric material are not the same, the second polymeric material is preferably insoluble in the solvent used to coat the barrier layer so that the barrier layer can be coated over the underlayer without dissolving the underlayer. The second polymeric material is also preferably insoluble in the solvent used to coat the top layer so that the top layer can be coated over the underlayer without dissolving the underlayer.

Polymeric materials useful as the second polymeric material include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof.

Solvent resistant underlayers are disclosed in Shimazu, WO 01/46318. Particularly useful polymeric materials are copolymers that comprise, in polymerized form, N-substituted maleimides, especially N-phenylmaleimide; methacrylamides, especially methacylamide; and acrylic and/or methacrylic acid, especially methacrylic acid. More preferably two functional groups are present in the polymeric material, and most preferably all three functional groups are present in the polymeric material. The preferred polymeric materials of this type are copolymers of N-phenylmaleimide, methacrylamide, and methacrylic acid, more preferably those that contain, in polymerized form, about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other aqueous alkaline soluble monomers, such as acrylic acid, may be used in place of some or all of the methacrylic acid.

These polymeric materials are soluble in aqueous alkaline developers. In addition they are soluble in an about 50:40:10 wt % mixture of methyl lactate, diethyl ketone, and water; in an about 50:25:15:10 wt % mixture of methyl lactate, diethyl ketone, butyrolactone, and water; and in an about 15:42.5:42.5 wt % mixture of methyl lactatelmethanol/dioxolane. These and similar mixtures can be used as the coating solvent for the underlayer. However, they are poorly soluble in solvents such as acetone, iso-propyl alcohol, butyl acetate, and butanol, which can be used as solvents to coat the top layer over the underlayer without dissolving the underlayer. These polymeric materials are typically resistant to washes with 80 wt % diacetone alcohol/20 wt % water.

Another group of preferred polymeric materials for the second polymeric material are aqueous alkaline developer soluble copolymers that comprise, in polymerized form, a monomer that has a urea bond in its side chain (i.e., a pendent urea group), such are disclosed in Ishizuka, U.S. Pat. No. 5,731,127. These copolymers comprise about 10 to 80 wt %, preferably about 20 to 80 wt %, of one of more monomers represented by the general formula:

$$CH_2{=}C(R){-}CO_2{-}X{-}NH{-}CO{-}NH{-}Y{-}Z$$

in which R is —H or —$CH_3$; X is a bivalent linking group; Y is a substituted or unsubstituted bivalent aromatic group; and Z is —OH, —COOH, or —$SO_2NH_2$.

R is preferably —$CH_3$. Preferably X is a substituted or unsubstituted alkylene group, substituted or unsubstituted phenylene [$C_6H_4$] group, or substituted or unsubstituted naphthalene [$C_{10}H_6$] group; such as —$(CH_2)_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —($CH_2CH_2$)—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —$SO_2NH_2$, preferably —OH. A preferred monomer is:

$$CH_2{=}C(CH_3){-}CO_2{-}CH_2CH_2{-}NH{-}CO{-}NH{-}p{-}C_6H_4{-}Z$$

in which Z is —OH, —COOH, or —$SO_2NH_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide.

The polymeric materials described above are soluble in aqueous alkaline developers. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the top layer over the underlayer without dissolving the underlayer.

Both these groups of polymeric materials can be prepared by methods, such as free radical polymerization, well known to those skilled in the art. Synthesis of the aqueous alkaline soluble copolymers that have urea bonds in their side chains is disclosed, for example, in Ishizuka, U.S. Pat. No. 5,731,127.

Other aqueous alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include aqueous alkaline developer soluble copolymers that comprise, in polymerized form, about 10 to 90 mol % of a sulfonamide monomer unit, especially those that comprise N-(p-aminosulfonylphenyl)methacrylamide, N-(m-aminosulfonylphenyl)methacrylamide, N-(o-aminosulfonylphenyl)methacrylamide, and/or the corresponding acrylamide. Useful alkaline developer soluble polymeric materials that comprise a pendent sulfonamide group are disclosed in Aoshima, U.S. Pat. No. 5,141,838. Particularly useful polymeric materials comprise, in polymerized form, (1) the sulfonamide monomer unit, especially N-(p-aminosulfonylphenyl)methacrylamide; (2) acrylonitrile and/or methacrylonitrile; and (3) methyl methacrylate and/or methyl acrylate.

Combinations of alkaline developer soluble polymeric materials may be used in the underlayer to provide improved chemical resistance, i.e., resistance to both fountain solution and to aggressive washes. A combination of a polymeric material that is resistant to 80 wt % diacetone alcohol/20 wt % water, which tests resistance to a UV wash, with a polymeric material that is resistant to 80 wt % 2-butoxyethanol/20 wt % water, which tests resistance to alcohol sub fountain solution, surprisingly produces a layer that shows good resistance to both solvent mixtures. Preferably, the layer has (1) a one-minute soak loss of less than about 20%, more preferably less than about 10%, and most preferably less than about 5% in 80 wt % diacetone alcohol/20 wt % water, and (2) a one-minute soak loss of less than about 20%, more preferably less than about 10%, and most preferably less than about 10%, in 80 wt % 2-butoxyethanol/20 wt % water. One-minute soak loss is measured by coating the layer, typically at a coating weight of about 1.5 g/m$^2$, soaking the coated substrate in the appropriate solvent for one minute at room temperature, drying the coated substrate, and measuring the weight loss as a percent of the total weight of polymeric material present on the substrate.

The ability of an underlayer to withstand both fountain solution and aggressive washes can be estimated by a chemical resistance parameter (CRP), defined as follows:

$$CRP=[(100-a)(100-b)]/10^4$$

in which:

a is the one minute % soak loss in 80 wt % diacetone alcohol/20 wt % water; and b is the one minute % soak loss in 80 wt % 2-butoxyethanol/20 wt % water.

The chemical resistance parameter should be greater than about 0.4, preferably greater than about 0.5, and more preferably greater than about 0.6. In favorable cases a chemical resistance parameter of at least about 0.65 can be obtained. The one-minute soak loss in each solvent should be less than about 60%, preferably less than about 40%, and more preferably less than about 35%. Preferably, the one-minute soak loss should be less than about 60%, preferably less than about 40%, and more preferably less than about 35%, in one solvent and less than about 40%, more preferably less than about 30%; and more preferably less than about 20%, and most preferably less than about 10% in the other solvent.

Combination of (1) a copolymer that comprises N-substituted maleimides, especially N-phenylmaleimide; methacrylamides, especially methacrylamide; and acrylic and/or methacrylic acid, especially methacrylic acid (2) with an alkaline soluble copolymer that comprises a urea in its side chain or with an alkaline soluble copolymer that comprises 10 to 90 mol % of a sulfonamide monomer unit, especially one that comprise N-(p-aminosulfonylphenyl) methacrylamide, N-(m-aminosulfonylphenylmethacrylamide N-(o-aminosulfonylphenyl)methacrylamide, and/or the corresponding acrylamide, is especially advantageous. One or more other polymeric materials, such a phenolic resin, may also be present in the combination. Preferred other polymeric materials, when present, are novolac resins.

When a combination of polymeric materials is used, the underlayer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight these polymeric materials in the underlayer. Preferably the underlayer comprises about 40% to about 85% by weight of the polymeric material that is resistant to 80 wt % diacetone alcohol/20 wt % water and about 15% to about 60% of the polymeric material that is resistant to 80 wt % 2-butoxyethanol/20 wt % water, based on the total weight the first and second polymeric materials in the underlayer. These polymeric materials together typically comprise at least about 50 wt %, preferably at least about 60 wt %, and more preferably at least about 65 wt %, of the underlayer, based on total weight of the materials in the underlayer. Up to about 20 wt %, preferably about 1 to about 20 wt %, of other polymeric materials may be present in the underlayer, based on the total amount of all the polymeric materials in the underlayer.

The underlayer absorbs radiation, preferably radiation in the range of about 800 nm to 1200 nm, the range of radiation commonly used for imaging thermally imageable elements. An absorber, or mixture of absorbers, sometimes referred to as "a photothermal conversion material," is present in the underlayer. Photothermal conversion materials absorb radiation and convert it to heat. Photothermal conversion materials may absorb ultraviolet, visible, and/or infrared radiation and convert it to heat.

The photothermal conversion material is precluded from diffusing from the underlayer to the top layer by a barrier layer applied between the underlayer and the top layer. The barrier layer prevents migration of the photothermal conversion material from the underlayer to the top layer, and thus photothermal conversion material that would otherwise migrate into the top layer, is contained in the underlayer.

The photothermal conversion material is a dye, such as a dye of the squarylium, merocyanine, indolizine, pyrylium, or metal diothiolene class. Dyes that are soluble in the aqueous alkaline developer are preferred to prevent sludging of the developer by insoluble material. The dye may be chosen, for example, from indoaniline dyes, oxonol dyes, porphyrin derivatives, anthraquinone dyes, merostyryl dyes, pyrylium compounds, and sqarylium derivatives. Absorbing dyes are disclosed in numerous disclosures and patent applications in the field, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830 WS and ADS-1064 (both available from American Dye Source, Montreal, Canada), EC2117 (available from FEW, Wolfen, Germany), Cyasorb IR 99 and Cyasorb IR 165 (both available from Glendale Protective Technology), Epolite IV-62B and Epolite 111-178 (both available from the Epoline), PINA-780 (available from the Allied Signal Corporation), SpectraIR 830A and SpectraIR 840A (both available from Spectra Colors).

As is well known to those skilled in the art, the amount of an absorber required to absorb a particular amount of radiation can be determined from the thickness of the absorbing layer, the concentration of the absorber in the layer, and the extinction coefficient of the absorber at the imaging wavelength using Beers law. Typically the underlayer has a coating weight of about 2.0 g/m$^2$.

Barrier Layer

The barrier layer is between the underlayer and the top layer. The barrier layer provides a buffer region between the underlayer (containing a photothermal conversion material) and the top layer to reduce and prevent diffusion of the photothermal conversion material into the top layer.

The barrier layer comprises a third polymeric material that is soluble in aqueous alkaline developer. If the third polymeric material is different from the second polymeric material, it is preferably soluble in at least one organic solvent in which the second organic polymeric material is insoluble. The third polymeric material may be selected from the polymeric materials described as the second polymeric material. In addition to these, a preferred third polymeric material is polyvinyl alcohol.

The third polymeric material may be the same as the second polymeric material. In this case, although the barrier layer comprises the same polymeric material as the underlayer, the barrier layer is applied as a material substantially free of photothermal conversion material.

When the third polymeric material is the same as the second polymeric material, the barrier layer should be thick enough to prevent the photothermal conversion material from mixing with it during the coating process. The barrier layer should be at least half the thickness of the underlayer and more preferably as thick as the underlayer.

When the third polymeric material is different from the second polymeric material, a much thinner layer can be used. Use of a thick layer under these conditions adversely affects the resolution of the imaged element. The barrier layer should be less that about one-fifth as thick as the underlayer, preferably less than a tenth of the thickness of the underlayer.

Top Layer

The top layer is ink receptive and protects the underlying layer or layers from the developer. It is insoluble in aqueous alkaline developer prior to imaging. However, exposed (i.e., imaged) regions of the top layer are removable by an aqueous alkaline developer after thermal exposure (i.e., thermal imaging). Though not being bound by any theory or explanation, it is believed that thermal exposure causes the top layer to more readily dissolve or disperse in the aqueous developer and/or weakens the bond between the top layer and the barrier layer. This allows the developer to penetrate the top layer, the barrier layer, and the underlayer, and dissolve the barrier layer and the underlayer in the exposed regions, revealing the underlying hydrophilic surface of the hydrophilic substrate.

The top layer comprises a first polymeric material. The first polymeric material may be insoluble in the aqueous alkaline developer. It is removed and dispersed in the developer when the developer penetrates the top layer in the exposed regions and dissolves or disperses the underlying layer or layers in these regions. Useful polymers of this type include acrylic polymers and copolymers; polystyrene; styrene-acrylic copolymers; polyesters; polyamides; polyureas; polyurethanes; nitrocellulosics; epoxy resins; and combinations thereof. Preferred polymers of this type are polymethylmethacrylate, nitrocellulose and polystyrene.

The top layer may be a positive-working photoimageable composition. In this instance, the exposed regions of the top layer become more readily soluble in an aqueous alkaline developer following thermal exposure.

Positive-working photoimageable compositions are well known. They are discussed, for example, in Chapter 5 of *Photoreactive Polymers: the Science and Technology of Resists*, A. Reiser, Wiley, New York, 1989, pp. 178–225. These compositions comprise a first polymeric material that is a water insoluble, alkali soluble binder as well as a material that comprises a photosensitive moiety. The photosensitive moiety may be bonded to the first polymeric material and/or be present in a separate compound.

Polymers that contain phenolic hydroxyl groups, i.e., phenolic resins, are preferred. Preferably the first polymeric material is a light-stable, water-insoluble, alkaline developer-soluble, film-forming polymeric material that has a multiplicity of phenolic hydroxyl groups, either on the polymer backbone or on pendant groups. Phenolic groups impart aqueous alkaline developer solubility to the top layer and are also believed to form a thermally frangible complex with the dissolution inhibitor. Novolac resins, resol resins, acrylic resins that contain pendent phenol groups, and polyvinyl phenol resins are preferred phenolic resins. Novolac resins are more preferred.

Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions.

Other phenolic resins useful as the first polymeric material include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes. The first polymeric material may also be a water insoluble, base soluble polymeric compound having pendent sulfonamide groups, such as is described in Aoshima, U.S. Pat. No. 5,141,838 (EP 330,239).

The photosensitive moiety is typically the o-diazonaphthoquinone moiety. Compounds that contain the o-diazonaphthoquinone moiety (i.e., quinone-diazides), preferably compounds that comprise an o-diazonaphthoquinone moiety attached to a ballasting moiety that has a molecular weight of at least 1500, but less than about 5000, are preferred. Typically, these compounds are prepared by the reaction of a 1,2-naphthoquinone diazide having a halogeno-sulfonyl group, typically a sulfonylchloride group, at the 4- or 5-position with a mono- or polyhydroxyphenyl compound, such as mono- or poly-hydroxy benzophenone.

Polymeric diazonaphthoquinone compounds include derivatized resins formed by the reaction of a reactive derivative that contains a diazonaphthoquinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphthoquinone moiety is well known in the art and is described, for example, in West, U.S. Pat. Nos. 5,705,308, and 5,705,322.

In one aspect, the positive-working thermally imageable top layer comprises the first polymeric material and a dissolution inhibitor. Such systems are disclosed in, for example, Parsons, WO 97/39894 and U.S. Pat. No. 6,280,899; Nagasaka, EP 0 823 327; Miyake, EP 0 909 627; West, WO 98/42507; and Nguyen, WO 99/11458. The first polymeric material is typically a phenolic resin, such as a novolac resin.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds containing other polar groups, such as ether, amine, azo, nitro, ferrocenium, sulfoxide, sulfone, and disulfone may also be useful as dissolution inhibitors. Monomeric or polymeric acetals having recurring acetal or ketal groups, monomeric or polymeric ortho carboxylic acid esters having at least one ortho carboxylic acid ester or amide group, enol ethers, N-acyliminocarbonates, cyclic acetals or ketals, β-ketoesters or β-ketoamides may also be useful as dissolution inhibitors.

Compounds that contain a positively charged (i.e., quaternized) nitrogen atom useful as dissolution inhibitors include, for example, tetraalkyl ammonium compounds, quinolinium compounds, benzothiazolium compounds, pyridinium compounds, and imidazolium compounds.

Quaternized heterocyclic compounds are useful as dissolution inhibitors. Representative imidazolium compounds include Monazoline C, Monazoline O, Monazoline C Y, and Monazoline T, all of which are manufactured by Mona Industries. Representative quinolinium dissolution inhibitors include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl) benzothiazolium cationic dyes and 3-ethyl-2-methyl benzothiazolium iodide. Suitable pyridinium dissolution inhibitors include cetyl pyridinium bromide and ethyl viologen dications.

Diazonium salts are useful as dissolution inhibitors and include, for example, substituted and unsubstituted diphenylamine diazonium salts, such as methoxy-substituted diphenylamine diazonium hexafluoroborates. These compounds are particularly useful in non-preheat plates.

A preferred group of dissolution inhibitors are triarylmethane dyes, such as ethyl violet, crystal violet, malachite green, brilliant green, Victoria blue B, Victoria blue R, and Victoria blue BO. These compounds can also act as contrast dyes, which distinguish the unimaged regions from the imaged regions in the developed imageable element.

The dissolution inhibitor may be a compound that comprises an o-diazo-naphthoquinone moiety, such as is discussed below. The derivatized resins that comprise an o-diazonaphthoquinone moiety can act as both the first polymeric material and the dissolution inhibitor. They can be used alone, or they can be combined with other polymeric materials and/or dissolution inhibitors.

When a dissolution inhibitor is present in the top layer, its amount can vary widely, but generally it is at least about 0.1 wt %, typically about 0.5 wt % to about 30 wt %, preferably about 1 wt % to 15 wt %, based on the total dry composition weight of the layer.

Alternatively, or additionally, the first polymeric material itself can comprise polar groups that act as acceptor sites for hydrogen bonding with the hydroxy groups present in the polymeric material and, thus, act as a dissolution inhibitor. Using well-known methods, a portion of the hydroxyl groups of the binder can be derivatized to introduce polar groups, for example carboxylic acid esters, such as benzoate esters; phosphate esters; ethers, such as phenyl ethers; and sulfonic acid esters, such as methyl sulfonates, phenyl sulfonates, p-toluene sulfonates (tosylates), and p-bromophenyl sulfonates (brosylates). An example of a resin derivatized with a compound that comprises a diazonaphthoquinone moiety is P-3000, a naphthoquinone diazide of a pyrogallol/acetone resin (available from PCAS, France). These derivatized polymeric materials can act as both the second polymeric material and a dissolution inhibitor. They can be used alone in the top layer, or they can be combined with other polymeric materials and/or dissolution inhibitors.

Alternatively, the top layer may contain the first polymeric material but be free of materials that function as dissolution inhibitors for the first polymeric material. In this case, the top layer consists essentially of the first polymeric material. These systems are disclosed in Hauck, U.S. patent application Ser. No. 09/638,556, filed Aug. 14, 2000. These systems are developed in alkaline solutions having a pH of at least 7 to about 11. Preferably the aqueous alkaline developer for these systems has a pH about 8 to about 10.5, more preferably about 9 to 10, and even more preferably about 10. Developers with a pH in the range of 13 or higher cannot be used with these systems.

The top layer may also comprise a dye to aid in the visual inspection of the exposed and/or developed element. Printout dyes distinguish the exposed regions from the unexposed regions during processing. Contrast dyes distinguish the unimaged regions from the imaged regions in the developed plate.

Substantially all the imaging radiation should be absorbed by the underlayer. Although the top layer may absorb ultraviolet and/or visible radiation, such as when a dye such as ethyl violet is used as the dissolution inhibitor or when a dye is added to the top layer for inspection purposes, the top layer should be substantially free of materials that absorb imaging radiation, typically infrared radiation in the range of about 800 nm to about 1200 nm, more typically radiation at about 830 nm or at about 1056 nm. In particular, the top layer should be substantially free of the photothermal conversion material.

Preparation of the Thermally Imageable Element

The thermally imageable element may be prepared by sequentially applying the underlayer over the hydrophilic surface of the hydrophilic substrate, applying the barrier layer over the underlayer and then applying the top layer over the barrier layer using conventional coating and/or lamination methods. However, it is important to avoid intermixing the layers during this process. In particular, it is important that the top layer and the barrier layer be substantially free of the photothermal conversion material.

The underlayer may be applied over the hydrophilic substrate by any conventional method. Typically the ingredients are dispersed or dissolved in a suitable coating solvent, and the resulting mixtures coated by conventional methods, such as spin coating, bar coating, gravure coating, or roller coating. The barrier layer may be applied over the underlayer, typically to the surface of the underlayer, by any conventional method, such as those listed above. The term "solvent" includes mixtures of solvents, especially mixtures of organic solvents.

Selection of the solvents used to coat the layers depends on the nature of the first polymeric material, the photothermal conversion material, the second polymeric material, and the third polymeric material, if present, as well as the other ingredients present in the layers, if any. When the second polymeric material and the third polymeric material are different, to prevent the underlayer from dissolving and mixing with the barrier layer when the barrier layer is coated over the underlayer, the barrier layer is preferably coated from a solvent in which the second polymeric material is essentially insoluble. Thus, the coating solvent for the barrier layer may be a solvent in which the second polymeric material and the other components of the underlayer are essentially insoluble.

Although the solvents used depend on the nature of the polymeric materials, typically the first polymeric material will be soluble in more polar solvents and insoluble in less polar solvents so that the solvent used to coat the barrier layer and the solvent used to coat the underlayer are less polar than the solvent used to coat the top layer.

Alternatively, the top layer may be coated as an aqueous dispersion to avoid dissolving the underlayer during the coating process. Alternatively, the underlayer, the barrier layer, the top layer or all layers may be applied by conventional extrusion coating methods from a melt mixture of layer components. Typically, such a melt mixture contains no volatile organic solvents.

In another aspect of the invention, the photothermal conversion material and the solvents used to coat the top layer and the underlayer can be selected so that the photothermal conversion material does not migrate into the top layer when the top layer is coated directly on top of the underlayer. Thus, when an appropriate dye is used as the photothermal conversion material and the top layer is coated from an appropriate solvent, a barrier layer is not necessary to prevent movement of the photothermal conversion material into the top layer during the coating step.

It has been found that, even in the absence of a barrier layer, the top layer remains essentially free of photothermal conversion material when the top layer is coated onto an underlayer comprising IR Dye B, IR Dye C, and/or IR Dye D, whose structures are shown below. The top layer is coated from diethyl ketone, methyl iso-butyl ketone, methyl iso-butyl ketone/methyl ethyl ketone (about 50:50 by weight), methyl ethyl ketone/toluene/3-ethoxyproprionate (about 50:20:30 by weight), or a similar solvent. The underlayer may be coated, for example, from an about 50:40:10 wt % mixture of methyl lactate, diethyl ketone, and water; an about 50:25:15:10 wt % mixture of methyl lactate, diethyl ketone, butyrolactone, and water; an about 15:42.5:42.5 wt % mixture of methyl lactate/methanol/dioxolane; or a similar solvent.

Imaging and Processing

Imaging of the thermally imageable element may be carried out by well-known methods. The element may be imaged with a laser or an array of lasers emitting modulated near infrared or infrared radiation in a wavelength region that is absorbed by the underlayer. Infrared radiation, especially infrared radiation in the range of about 800 nm to about 1200 nm, is typically used for imaging thermally imageable elements. Imaging is conveniently carried out with a laser emitting at about 830 nm or at about 1056 nm. Suitable commercially available imaging devices include image setters such as the CRE® Trendsetter (CREO, British Columbia, Canada) and the Gerber Crescent 42T (Gerber).

Imaging produces an imaged element, which comprises a latent image of imaged (exposed) regions and unimaged (unexposed) regions. Development of the imaged element to form a printing plate, or printing form, converts the latent image to an image by removing the exposed regions, revealing the hydrophilic surface of the underlying substrate.

The developer may be any liquid or solution that can penetrate and remove the exposed regions of the top layer, the underlying regions of the barrier layer, if present, and the underlying regions of the underlayer without substantially affecting the complimentary unexposed regions. While not being bound by any theory or explanation, it is believed that thermal exposure modifies the top layer so that it is more penetrable by the developer. This allows the developer to more readily penetrate the top layer and dissolve the underlayer in the exposed regions. Development is carried out for a long enough time to remove the exposed regions of the top layer, the underlying regions of the barrier layer, if present, and the underlying regions of the underlayer, but not long enough to remove the unexposed regions of the top layer. Hence, the exposed regions are described as being "soluble" or "removable" in the developer because they are removed, and dissolved and/or dispersed, more rapidly in the developer than the unexposed regions. Typically, the underlayer is dissolved in the developer, the barrier layer is either dissolved or dispersed in the developer, and the top layer is dispersed in the developer.

For top layers that comprise a dissolution inhibitor, useful developers are solutions having a pH of about 7 or above. Preferred alkaline developers are those that have a pH between about 8 and about 13.5, typically at least about 11, preferably at least about 12. Useful developers include commercially available developers, such as PC3000, PC955, PC 956, and PC9000, alkaline developers each available from Kodak Polychrome Graphics LLC. Developers are described for example, in Yamasue, U.S. Pat. No. 4,259,434; Seino, U.S. Pat. No. 4,452,880; Miller, U.S. Pat. No. 5,851,735; Eckler, U.S. Pat. No. 5,998,102; Miro, EP-A-0 732 628; Toyama, GB-A-2,276,729 (DE-A-4 411 176); and Fiebag, U.S. Pat. No. 6,143,479.

Development is typically carried out in a processor equipped with an immersion-type-developing bath, a section for rinsing with water, a gumming section, a drying section, and a conductivity-measuring unit. Typically, the developer is applied to the imaged precursor by rubbing or wiping the element with an applicator containing the developer. Alternatively, the imaged precursor may be brushed with the developer or the developer may be applied to the precursor by spraying the element with sufficient force to remove the exposed regions. In either instance, a printing plate is produced. Development may be carried out in a commercially available processor, such as a Mercury Mark V Processor (Kodak Polychrome Graphics).

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example polyvinyl alcohol, polymethacrylic acid, polymethacrylamide, polyhydroxyethylmethacrylate, polyvinylmethylether, gelatin, and polysaccharide such as dextran, pullulan, cellulose, gum arabic, and alginic acid. A preferred material is gum arabic.

A developed and gummed plate may also be baked to increase the run length of the plate. Baking can be carried out, for example at about 220° C. to about 240° C. for about 7 to 10 minutes, or at a temperature of 120° C. for 30 min.

Alternatively, the element may be developed with a combined developing and gumming solution, which has a pH of about 10.0 to about 14 and about 10 wt % to about 30 wt % of one or more water-soluble polyhydroxy compounds of the structure $R^1(CHOH)_nR^2$, in which n is 4 to 7; and either (i) $R^1$ is hydrogen, aryl, or $CH_2OH$; and $R_2$ is hydrogen, alkyl group having 1 to 4 carbon atoms, $CH_2OR^3$ in which $R^3$ is hydrogen or an alkyl group having 1 to 4 carbon atoms, $CH_2N(R^4R^5)$ in which $R^4$ and $R^5$ are each independently hydrogen or an alkyl group having 1 to 4 carbon atoms, or $CO_2H$, or (ii) $R^1$ and $R^2$ together form a carbon—carbon single bond. Useful water-soluble polyhydroxy compounds include, for example, mannitol, sorbitol, xylitol, ribitol, and arabitol meso-inosit, ribonic acid, gluconic acid, mammonic acid, gulonic acid, glucamine, N-methyl-glucamine, and 1-desoxy-1-(methylamino)-galactit. In this case, the separate gumming step is unnecessary and is omitted.

Once the imageable element has been imaged and developed, printing can then be carried out by applying a fountain solution and then a lithographic ink to the image on the surface of the element. The fountain solution is taken up by the imaged (exposed) regions, i.e., the surface of the hydrophilic substrate revealed by the imaging and development process, and the ink is taken up by the unimaged (unexposed) regions. The ink is then transferred to a suitable receiving material (such as cloth, paper, metal, glass or plastic) either directly or indirectly through the use of an offset printing blanket to provide a desired impression of the image thereon. The imaging members can be cleaned between impressions, if desired, using conventional cleaning means.

The advantageous properties of this invention can be observed by reference to the following examples, which illustrate but do not limit the invention. In the specification, examples, and claims, unless indicated otherwise, all percentages are percentages by weight, based on the weight of the developer.

EXAMPLES

| Glossary | |
|---|---|
| AEROSOL ® OT | Surfactant (Cytec Industries Inc., West Paterson, NJ, USA) |
| BYK 307 | Polyethoxylated dimethylpolysiloxane copolymer (Byk-Chemie, Wallingford, CT, USA) |
| Copolymer A | Copolymer of N-phenylmaleimide, methacrylamide, and methacrylic acid (45:35:20 mol %) |
| CYMEL ®-303 | Hexamethoxymethylmelamine (American Cyanamid, Toronto, Ontario, Canada) |
| Ethyl Violet | C.I. 42600; CAS 2390-59-2 ($\lambda_{max}$ = 596 nm) [(ρ-$(CH_3CH_2)_2NC_6H_4)_3C^+Cl^-$] |
| IR Dye B | Infrared absorbing dye (Eastman Kodak, Rochester, NY, USA) |
| IR Dye C | Infrared absorbing dye (Eastman Kodak, Rochester, NY, USA) |
| IR Dye D | Infrared absorbing dye (Eastman Kodak, Rochester, NY, USA) |
| NACURE ® 2530 | Amine blocked ρ-toluene sulfonic acid (King Industries Specialty Chemicals, Norwalk, CT, USA) |
| AIRVOL ® 103 | Poly (vinyl alcohol) (Air Products, Allentown, PA, USA) |
| SD140A | Novolac resin (Borden Chemical, Columbus, OH, USA) |
| Solvent Blue 35 | C.I. 61554, CAS 17354-14-2; 1,4-bis(butylamino)-9,10-anthracenedione |
| TRITON ® X-100 | Octoxynol-9, ethoxylated alkyl phenol (Rohm & Haas, Philadelphia, PA, USA) |
| IR Dye A | Infrared absorbing dye ($\lambda_{max}$ = 830 nm) (Eastman Kodak, Rochester, NY, USA) |
| WITCO ® Bond W-240 | Polyurethane resin (Crompton Corp., Chicago, IL, USA) |
| ZONYL ® FSN | Fluorosurfactant (DuPont Canada, Inc., Specialty Chemicals, Streetville, Mississauga, ON, CANADA) |

IR Dye A

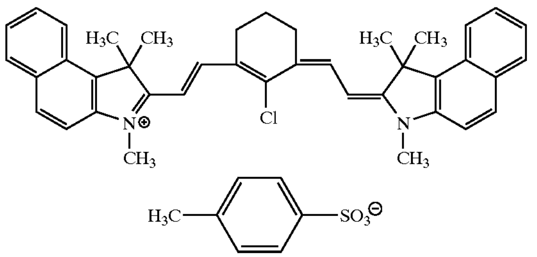

IR Dye B

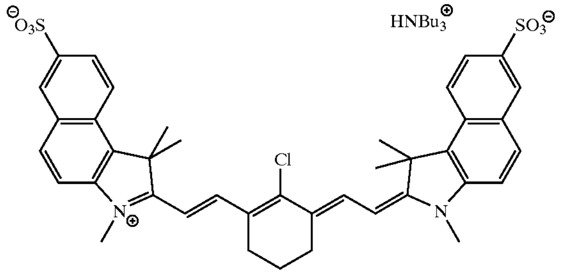

IR Dye C

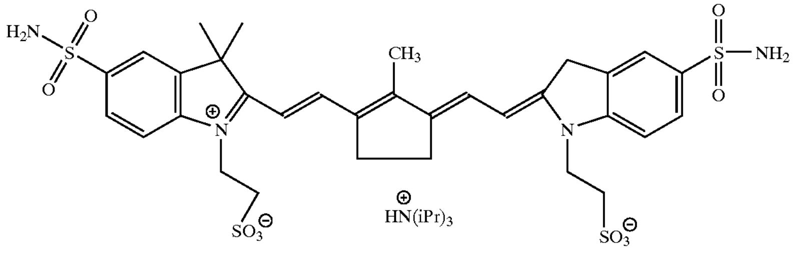

-continued

IR Dye D

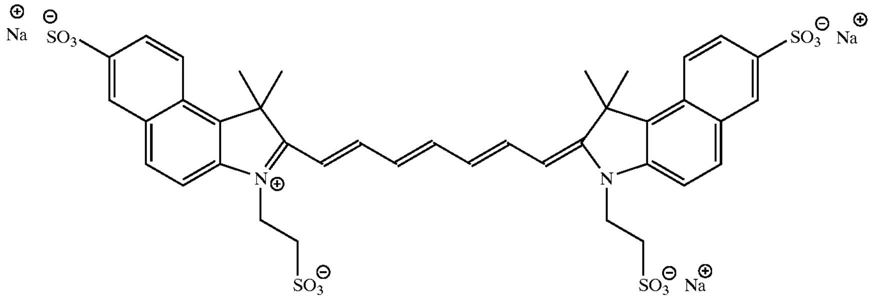

Example 1

A multi-layer imageable element was prepared as follows.

Underlayer A coating solution containing 85 wt % copolymer A and 15 wt % IR Dye A photothermal conversion material (5.4 wt % total solids) was coated onto a 3 gauge, aluminum sheet that has been electrograined, anodized and subject to treatment with a solution of polyvinylphosphonic acid. The coating solvent was methyl lactate/diethyl ketone/water (50:40:10 by weight). The coating weight was 2.0 $g/m^2$.

Barrier Layer The barrier layer was coated over the underlayer from a solution of polyvinyl alcohol in water containing 0.1% each of ZONYL® FSN and Aerosol OT. Three samples were prepared. The layer had a dry coating weight of 0.011, 0.022 and 0.054 $g/m^2$.

Top Layer A top layer of SD 140A (96.3%) and ethyl violet (3.7%) (5.4 wt % total solids) was applied on top of the barrier layers from a solution in 2-pentanone. The coating weight was 0.7 $g/m^2$.

Control A control element was prepared with the substrate, underlayer and top layer as above, but without a barrier layer.

Migration of photothermal conversion material into the top layer was assessed by stripping off the top layer of each element with 2-pentanone and scanning the visible and near infrared regions of the resulting solution with a spectrophotometer. No absorption at 830 nm was detected in the top layer from the elements with the poly(vinyl alcohol) barrier layer. However, the solution from the control element without the PVA barrier layer absorbed at 830 nm, indicating the presence of the photothermal conversion material.

Samples of each element were imaged with 830 nm radiation with the internal test pattern (plot 12) on CREO® 3230 Trendsetter at 100–175 $mJ/cm^2$ (9W) and machine processed with 956 Developer (solvent based developer, Kodak Polychrome Graphics, Norwalk, Conn., USA) In a Kodak Polychrome Graphics 85 NS Processor.

At the lowest barrier layer coating weight (0.011 $g/m^2$.), the resolution appeared to be at least 2–98% at 150 lines per inch. Some resolution loss was evident at the barrier layer coating weight of 0.022 $g/m^2$. At a barrier layer coating weight of 0.054 $g/m^2$, significant image attack was observed following processing.

Example 2

A multi-layer imageable element was prepared as follows.

Underlayer A coating solution containing 85 wt % copolymer A and 15 wt % IR Dye A photothermal conversion material (5.4% total solids) in was coated onto 0.3 gauge unsubbed polyester film. The coating solvent was methyl lactate/diethyl ketone/water (50:40:10 by weight). The coating weight of the underlayer was 2.0 $g/m^2$.

Barrier Layer The underlayer was then coated with a layer of copolymer A (5.4 wt % total solids) from methyl lactate: diethyl ketone: water (50:40:10 by weight), at dry coating weight of 0.7 $g/m^2$, and 2.0 $g/m^2$.

Top Layer A top layer of SD 140A (96.3%) and ethyl violet A (3.7%) was coated (5.4 wt %) from diethyl ketone was then applied on top of the barrier layer. The coating weight of the top layer was 0.7 $g/m^2$.

Control A control element was prepared with the substrate, underlayer and top layer as above, but without a barrier layer.

Movement of the photothermal conversion material into the top layer was assessed by stripping off the top layer of each element with diethyl ketone and scanning the visible and near infrared regions of the resulting solution with a spectrophotometer. No absorption at 830 nm was detected in the solution from the top layer from the element with the 2.0 $g/m^2$ coating weight barrier layer. There was absorption at 830 nm in solution from the control element with no barrier layer. Reduced absorption at 830 nm was observed in the solution from the top layer of the element with a 0.7 $g/m^2$ barrier layer.

Samples of each element were imaged with the internal test pattern (plot 12) on a CREO® 3230 trendsetter at 200 $mJ/cm^2$ and machine processed with 956 developer (solvent based developer, Kodak Polychrome Graphics, Norwalk, Conn., USA). For all samples, accurate copies of the imaging pattern were made.

Example 3

A control element, in which the photothermal conversion material was in the top layer, was prepared as follows. A coating solution containing copolymer A (5.4 wt % solids) was coated onto the substrate used in Example 1 from a solvent of methyl lactate/diethyl ketone/water (50:40:10) to produce an underlayer with a coating weight of 2.0 $g/m^2$. A coating solution containing 94.3 wt % SD 104A, 3.7 wt % ethyl violet, and 2.0 wt % IR Dye A (5.4 wt % total solids) in diethyl ketone was coated over the underlayer to produce a top layer with a coating weight of 0.7 $g/m^2$.

A scanning electron micrograph was taken of an unexposed element. No ablated material was observed.

The control element was imaged with 50% dots on a CREO® 3230 trendsetter at 120 $mJ/cm^2$. The exposed control element developed satisfactorily in Developer 956 (solvent based developer, Kodak Polychrome Graphics, Norwalk, Conn., USA).

A scanning electron micrograph was taken of a control element exposed as described, above but not developed. A large amount of ablated material was observed covering the entire surface of the imaged control element.

A scanning electron micrograph was taken of the element described in Example 1, with barrier layer coating weight of 0.022 g/$m^2$, exposed as described above but not developed. No ablated material was observed.

Example 4

Underlayer The underlayer was coated on the substrate as described in Example 1.

Top Layer A top layer containing 94 wt % of SD 140A and 6 wt % of solvent blue 35 was coated over the underlayer. The coating solvent was ethyl 3-ethoxypropionate/toluene (30:70).

A control was prepared in which ethyl violet was used instead of solvent blue 35. Diethyl ketone was the coating solvent.

The effectiveness of each system at preventing migration of the photothermal conversion material into the top-coat was assessed by stripping off the top-coat by rinsing with 3-ethoxypropionate/toluene (30:70) and analyzing the resulting solutions as described in Example 1.

No absorption at 800 to 850 nm was detected in the solution from the element in which the top layer was coated from ethyl 3-ethoxypropionate/toluene (30:70). Absorption at 830 nm was detected in the solution from the element in which the top layer was coated from diethyl ketone.

Samples of each element were imaged on a CREO® 3230 Trendsetter at 120 mJ/$cm^2$ and machine processed with 956 Developer (solvent based developer, Kodak Polychrome Graphics, Norwalk, Conn., USA). For all elements, accurate copies of the imaging pattern were made.

Example 5

The example illustrates the use of IR Dye B, IR Dye C, and IR Dye D in the underlayer of elements that do not comprise a barrier layer.

Underlayer Four elements were prepared. In the control element the underlayer was prepared as described in Example 1. In the other three elements, the underlayer was prepared as described in Example 1 except that IR Dye B was substituted for IR Dye A in one element, IR Dye C was substituted for IR Dye A in one element, and IR Dye D was substituted for IR Dye A in one element.

Top Layer A top layer containing 96.3 wt % of SD 140A and 3.7 wt % of ethyl violet was coated over the four underlayers. The coating solvent was diethyl ketone. No barrier layer was present in any of the four elements.

Movement of the photothermal conversion material into the top layer was assessed by stripping off the top layer with 3-ethoxypropionate/toluene (30:70) and analyzing the resulting solutions as described in Example 1. No absorption at 800 to 850 nm was detected in the solution from the elements in which the underlayer contained either IR Dye B, IR Dye C or IR Dye D. Absorption at 830 nm was detected in the solution from the control element.

Samples of each element were imaged on a CREO® 3230 Trendsetter at 120 mJ/$cm^2$ and machine processed with 956 Developer (solvent based developer, Kodak Polychrome Graphics, Norwalk, Conn., USA). For all elements, reasonable copies of the imaging pattern were made.

Having described the invention, we now claim the following and their equivalents.

What is claimed is:

1. An imageable element comprising, in order:

(a) a hydrophilic substrate;

(b) an underlayer, (c) a barrier layer; and, (d) a top layer;

in which:

the top layer comprises a first polymeric material;

the underlayer comprises a second polymeric material;

the barrier comprises a third polymeric material;

the top layer is ink receptive and insoluble in an alkaline developer prior to thermal exposure of the element;

the top layer, the barrier layer, and the underlayer are each removable by the alkaline developer following thermal exposure of the element;

the underlayer comprises a photothermal conversion material; and the barrier layer and the top layer are substantially free of photothermal conversion material.

2. The element of claim 1 in which the first polymeric material is selected from the group consisting of acrylic polymers and copolymers; polystyrene; styrene-acrylic copolymers; polyesters, polyamides; polyureas; polyurethanes; nitrocellulosics; epoxy resins; and combinations thereof.

3. The element of claim 1 in which the first polymeric material is a phenolic polymer.

4. The element of claim 1 in which the first polymeric material is a novolac resin, and the top layer additionally comprises a dissolution inhibitor.

5. The element of claim 1 in which the third polymeric material is polyvinyl alcohol.

6. The element of claim 5 in which the first polymeric material is a novolac resin and the top layer additionally comprises a dissolution inhibitor.

7. The element of claim 1 in which the second polymeric material and the third polymeric material are the same material, and the barrier layer is at least half the thickness of the underlayer.

8. The element of claim 7 in which the first polymeric material is a novolac resin and the top layer additionally comprises a dissolution inhibitor.

9. The element of claim 1 in which the chemical resistance parameter for the underlayer is greater than about 0.5.

10. The element of claim 1 in which the second polymeric material comprises about 35 to about 60 mol % of N-phenylmaleimide, about 15 to about 40 mol % of methacryamide, and about 10 to about 30 mol % of methacrylic acid.

11. The element of claim 10 in which the first polymeric material is a novolac resin, and the top layer additionally comprises a dissolution inhibitor.

12. The element of claim 11 in which the third polymeric material is polyvinyl alcohol.

13. A method for forming an image, the method comprising the steps of:

(a) imaging an imageable element with radiation in the range of about 800 nm to about 1200 nm and forming an imaged element comprising exposed and unexposed regions; and (b) developing the imaged element in a developer and removing the exposed regions;

in which:

imageable element comprising, in order:

(a) a hydrophilic substrate;

(b) an underlayer, (c) a barrier layer; and, (d) a top layer;

in which:

the top layer comprises a first polymeric material;

the underlayer comprises a second polymeric material;

the barrier layer comprises a third polymeric material;

the top layer is ink receptive and insoluble in an alkaline developer prior to thermal exposure of the element;

the top layer, the barrier layer, and the underlayer are each removable by the alkaline developer following thermal exposure of the element;

the underlayer comprises a photothermal conversion material; and the barrier layer and the top layer are substantially free of photothermal conversion material.

14. The method of claim 13 in which the first polymeric material is selected from the group consisting of acrylic polymers and copolymers; polystyrene; styrene-acrylic copolymers; polyesters, polyamides; polyureas; polyurethanes; nitrocellulosics; epoxy resins; and combinations thereof.

15. The method of claim 13 in which the first polymeric material is a phenolic polymer.

16. The method of claim 13 in which the first polymeric material is a novolac resin, and the top layer additionally comprises a dissolution inhibitor.

17. The method of claim 16 in which the developer has a pH between about 8 and about 13.5.

18. The method of claim 13 in which the third polymeric material is polyvinyl alcohol.

19. The method of claim 18 in which the first polymeric material is a novolac resin, and the top layer additionally comprises a dissolution inhibitor.

20. The method of claim 13 in which the chemical resistance parameter for the underlayer is greater than about 0.5.

21. The method of claim 13 in which the second polymeric material comprises, in polymerized form, about 35 to about 60 mol % of N-phenylmaleimide, about 15 to about 40 mol % of methacryamide, and about 10 to about 30 mol % of methacrylic acid.

22. The method of claim 21 in which the first polymeric material is a novolac resin and the top layer additionally comprises a dissolution inhibitor.

23. The method of claim 22 in which the third polymeric material is polyvinyl alcohol.

24. The method of claim 13 in which the first polymeric material is a novolac resin, the top layer additionally comprises a dissolution inhibitor; and the developer is an aqueous alkaline developer.

25. A method for forming an imageable element useful as a printing plate precursor, the method comprising the steps of:

(a) forming an underlayer on the hydrophilic surface of a hydrophilic substrate; and (b) forming a top layer on the underlayer;

in which:

the top layer is formed by coating a first coating solution comprising a first coating solvent and a first polymeric material on the underlayer;

the underlayer is formed by coating a second coating solution comprising a second coating solvent, a second polymeric material, and a photothermal conversion material on the hydrophilic surface;

the top layer is ink receptive and insoluble in an alkaline developer prior to thermal exposure of the element;

the top layer and the underlayer are each removable by the alkaline developer following thermal exposure of the element;

the top layer is substantially free of photothermal conversion material; and the photothermal conversion material is selected from the group consisting of

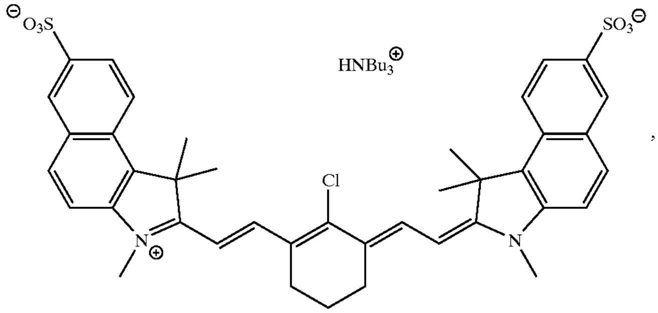

,

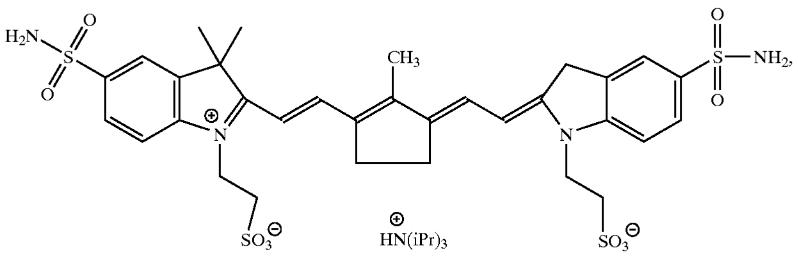

,

-continued

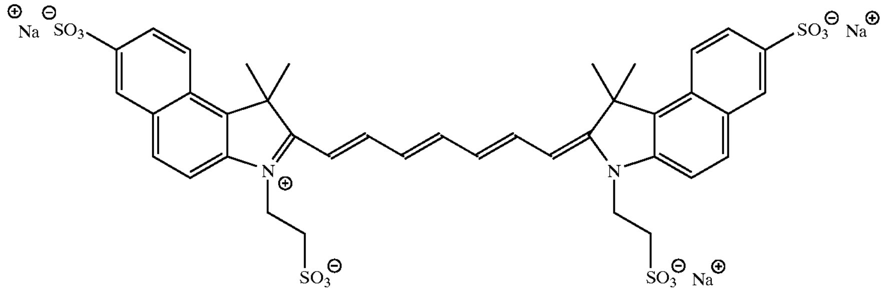

, and combinations thereof.

26. The method of claim 25 in which the first coating solvent is selected from the group consisting of diethyl ketone, methyl iso-butyl ketone, about 50:50 wt % methyl iso-butyl ketone/methyl ethyl ketone, and about 50:20:30 wt % methyl ethyl ketone/toluene/3-ethoxyproprionate.

27. The method of claim 26 in which the second polymeric material comprises, in polymerized form, about 25 to about 75 mol % of N-phenylmaleimide; about 10 to about 50 mol % of methacrylamide; and about 5 to about 30 mol % of methacrylic acid.

28. The method of claim 27 in which the second coating solvent is selected from the group consisting of an about 50:40:10 wt % mixture of methyl lactate, diethyl ketone, and water; an about 50:25:15:10 wt % mixture of methyl lactate, diethyl ketone, butyrolactone, and water; and an about 15:42.5:42.5 wt % mixture of methyl lactate/methanol/dioxolane.

29. The method of claim 28 in which the first polymeric material comprises a novolac resin.

30. A imageable element comprising, in order:

(a) a hydrophilic substrate;

(b) an underlayer, and, (c) a top layer;

in which:

the top layer comprises a first polymeric material;

the underlayer comprises a second polymeric material;

the top layer is ink receptive and insoluble in an alkaline developer prior to thermal exposure of the element;

the top layer, and the underlayer are each removable by the alkaline developer following thermal exposure of the element;

the underlayer comprises a photothermal conversion material;

the top layer is substantially free of photothermal conversion material, and the photothermal conversion material is selected from the group consisting of

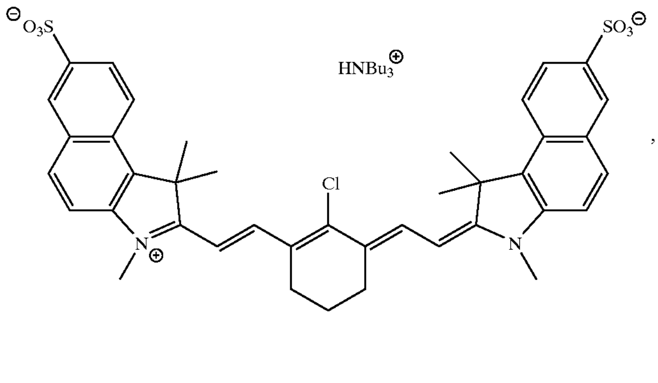

,

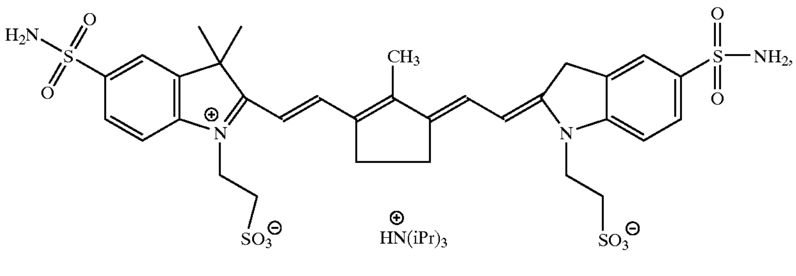

,

-continued
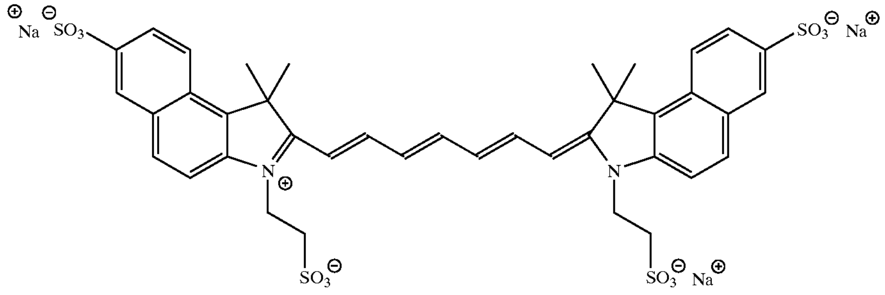
,
and combinations thereof.
31. The element of claim 30 in which the second polymeric material comprises, in polymerized form, about 35 to about 60 mol % of N-phenylmaleimide, about 15 to about 40 mol % of methacryamide, and about 10 to about 30 mol % of methacrylic acid.
* * * * *